(12) United States Patent
Hattori et al.

(10) Patent No.: US 9,552,923 B2
(45) Date of Patent: *Jan. 24, 2017

(54) ELECTRONIC COMPONENT

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,785

(22) Filed: Jun. 1, 2015

(65) Prior Publication Data

US 2015/0262753 A1    Sep. 17, 2015

Related U.S. Application Data

(63) Continuation of application No. 14/151,099, filed on Jan. 9, 2014, now Pat. No. 9,082,550, which is a (Continued)

(30) Foreign Application Priority Data

Jul. 11, 2011   (JP) .................. 2011-152901

(51) Int. Cl.
| | |
|---|---|
| *H05K 7/00* | (2006.01) |
| *H05K 1/11* | (2006.01) |
| *H01G 2/06* | (2006.01) |
| *H05K 3/34* | (2006.01) |
| *H05K 1/18* | (2006.01) |

(Continued)

(52) U.S. Cl.
CPC .............. *H01G 2/065* (2013.01); *H01G 2/06* (2013.01); *H01G 4/12* (2013.01); *H05K 1/181* (2013.01); *H05K 3/3442* (2013.01); *H05K 1/141* (2013.01); *H05K 2201/049* (2013.01); *H05K 2201/09181* (2013.01); *H05K 2201/10636* (2013.01); *Y02P 70/611* (2015.11); *Y02P 70/613* (2015.11)

(58) Field of Classification Search
CPC ........ H01G 2/065; H01G 2/06; H05K 3/3442; H05K 2201/049; H05K 1/181; H05K 2201/10636; H05K 1/141; H05K 2201/09181

See application file for complete search history.

(56) References Cited

FOREIGN PATENT DOCUMENTS

JP    2004335657 A   * 11/2004

OTHER PUBLICATIONS

Hattori, "Electronic Component", U.S. Appl. No. 14/151,099, filed Jan. 9, 2014.

* cited by examiner

*Primary Examiner* — Hoa C Nguyen
(74) *Attorney, Agent, or Firm* — Keating & Bennett, LLP

(57) ABSTRACT

A multilayer ceramic capacitor includes flat inner electrodes that are laminated on each other. An interposer includes a substrate that is larger than the multilayer ceramic capacitor. A first mounting electrode to mount the multilayer ceramic capacitor is located on a first principal surface of the substrate, and a first external connection electrode for connection to an external circuit board is located on a second principal surface. A recess is located in a side surface of the interposer. A connecting conductor is located in the wall surface of the recess. The connecting conductor is located at a position spaced apart by a predetermined distance from the side surface of the interposer.

18 Claims, 4 Drawing Sheets

Related U.S. Application Data continuation of application No. PCT/JP2012/063841, filed on May 30, 2012.

(51) Int. Cl.
*H01G 4/12* (2006.01)
*H05K 1/14* (2006.01)

FIG. 2C
FIG. 2A
FIG. 2B
FIG. 2D
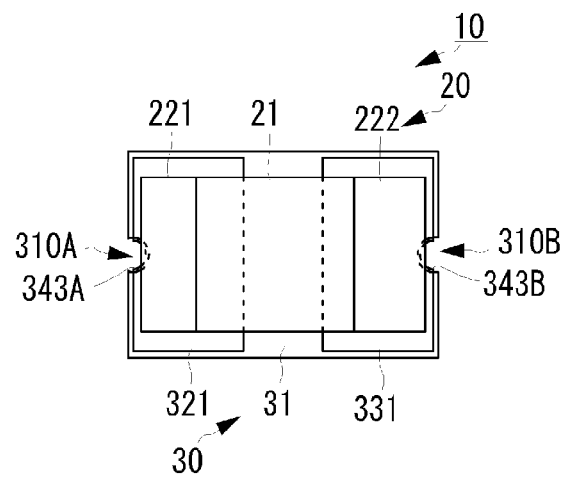
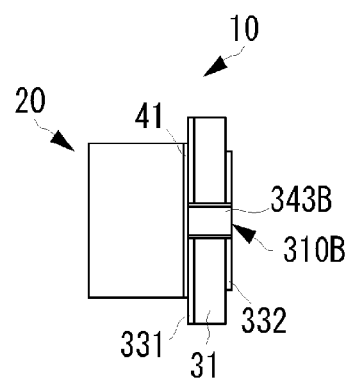
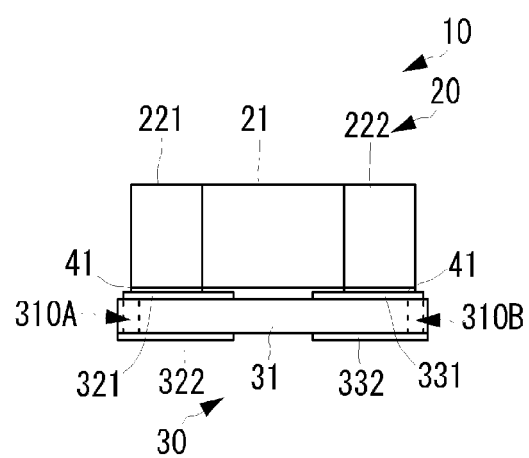
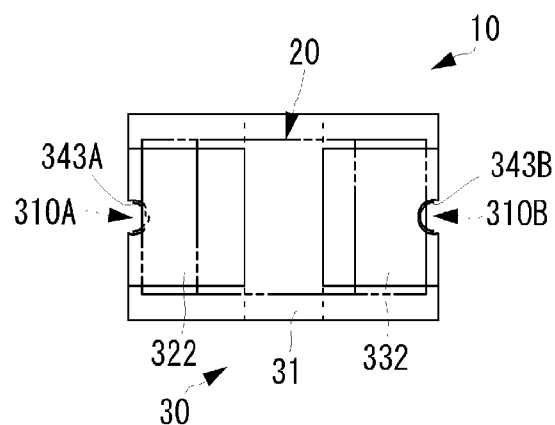

ELECTRONIC COMPONENT

BACKGROUND OF THE INVENTION

1. Field of the Invention

The present invention relates to an electronic component including a multilayer ceramic capacitor, and an interposer used when mounting the multilayer ceramic capacitor onto a circuit board.

2. Description of the Related Art

Currently, chip components, in particular, miniature multilayer ceramic capacitors are frequently used for mobile terminals such as cellular phones. A multilayer ceramic capacitor includes a rectangular component body that functions as a capacitor, and outer electrodes formed at opposite ends of the component body.

In related art, generally, as disclosed in Japanese Unexamined Patent Application Publication No. 8-55752, a multilayer ceramic capacitor is electrically and physically connected to a circuit board by placing outer electrodes directly on the mounting land of the circuit board of a mobile terminal, and bonding the mounting land and the outer electrodes together with a bonding agent such as a solder.

However, a multilayer ceramic capacitor is subject to mechanical distortion in some cases due to variations in the voltage applied to the multilayer ceramic capacitor. When this distortion occurs, the distortion is transmitted to the circuit board, causing the circuit board to vibrate. When the circuit board vibrates, vibration sound audible to the human ears occurs in some cases.

As a solution to this problem, for example, Japanese Unexamined Patent Application Publication No. 2004-134430 describes a configuration in which the multilayer ceramic capacitor is not directly mounted on the mounting land. In Japanese Unexamined Patent Application Publication No. 2004-134430, an interposer formed by an insulating substrate is used. In a case where an interposer is used, the multilayer ceramic capacitor is bonded to upper electrodes of the interposer, and lower electrodes of the interposer are bonded to mounting electrodes of the circuit board. The electrical continuity between each of the upper and lower electrodes is provided by a via-hole that penetrates the interposer.

However, Japanese Unexamined Patent Application Publication No. 2004-134430 adopts a special structure in which the arrangement direction of the lower electrodes and the arrangement direction of the upper electrodes in the interposer cross each other, that is, the arrangement direction of the outer electrodes of the multilayer ceramic capacitor and the arrangement direction of the mounting electrodes with respect to the circuit board of the interposer cross each other. Therefore, in a case where the multilayer ceramic capacitor is directly mounted onto the circuit board and vibration sound occurs, when an interposer is used as in Japanese Unexamined Patent Application Publication No. 2004-134430, changes to the land pattern or the like are required. However, such changes to the land pattern are difficult to achieve for circuit boards currently used which typically require high-density mounting. Accordingly, it is desired to allow easier structural design and mounting.

The present inventor has discovered that the solder applied when bonding the interposer to the circuit board climbs and wets onto the multilayer ceramic capacitor, and vibration of the multilayer ceramic capacitor is transmitted to the circuit board via the solder, thus compounding the problem caused by vibration of the multilayer ceramic capacitor. Accordingly, the present inventor has discovered a configuration that reduces the amount of applied solder that climbs and wets onto the multilayer ceramic capacitor to reduce transmission of vibration to the circuit board.

SUMMARY OF THE INVENTION

Accordingly, preferred embodiments of the present invention realize an electronic component that allows easy structural design and mounting, and has a mounting strength and electrical characteristics equivalent to those of mounting structures commonly used in related art.

An electronic component according to a preferred embodiment of the present invention includes a substrate that has a rectangular or substantially rectangular parallelepiped shape, the substrate including front and back surfaces that are parallel or substantially parallel to each other, and four side surfaces that are perpendicular or substantially perpendicular to the front and back surfaces, a first front surface electrode that is provided near one side surface on the front surface of the substrate, a second front surface electrode that is provided near a side surface parallel or substantially parallel to the one side surface on the front surface of the substrate, a first back surface electrode that is provided on a back surface of the substrate, opposite to the first front surface electrode, a second back surface electrode that is provided on the back surface of the substrate, opposite to the second front surface electrode, a chip component that has a rectangular or substantially rectangular parallelepiped shape, the chip component being mounted on the front surface, the chip component including a first outer electrode that is connected to the first front surface electrode, and a second outer electrode that is connected to the second front surface electrode, a first groove that is located in one of the four side surfaces, or in a corner portion defined by two side surfaces, the first groove being at least partially located between the first front surface electrode and the first back surface electrode, the first groove being arranged along a direction normal to the front and back surfaces, a second groove that is arranged in one of the four side surfaces, or in a corner portion defined by two side surfaces, the second groove being at least partially located between the second front surface electrode and the second back surface electrode, the second groove being arranged along the direction normal to the front and back surfaces, a first connecting conductor that is provided in a wall surface of the first groove, the first connecting conductor providing electrical continuity between the first front surface electrode and the first back surface electrode, and a second connecting conductor that is provided in a wall surface of the second groove, the second connecting conductor providing electrical continuity between the second front surface electrode and the second back surface electrode. The first front surface electrode and the first connecting conductor are spaced apart from the side surface or the two side surfaces defining the corner portion in which the first groove is located. The second front surface electrode and the second connecting conductor are spaced apart from the side surface or the two side surfaces defining the corner portion in which the second groove is located.

According to this configuration, each of the grooves is located in a side surface of the substrate, or in a corner portion defined by two side surfaces of the substrate. Therefore, for example, in a case where the electronic component is mounted onto the circuit board with a bonding agent such as a solder, the amount of bonding agent that is allowed to escape to the grooves increases, thus reducing the amount of bonding agent that climbs and wets onto the front surface electrodes. As a result, in a case where the chip component undergoes distortion due to variations in applied voltage, it is possible to reduce adhesion of the bonding agent to a region in which the distortion has occurred.

Further, the front surface electrodes and the connecting conductors are each provided at a predetermined distance from the side surface of the substrate in which each of the grooves is located. Therefore, when applying a bonding agent such as a solder, it is possible to prevent climbing and wetting of the solder from the side surface toward the front surface of the substrate. Because the amount of solder that climbs up and wets decreases, it is possible to significantly reduce or prevent transmission of vibration of the chip component via the substrate to the circuit board on which the electronic component is mounted. Furthermore, because each of the connecting conductors is provided at a distance from the side surface of the substrate, it is possible to prevent burrs from being generated in the portion of the connecting conductors when cutting the side surface of the substrate in the cutting process during manufacture. As a result, a defect in the bond created by the bonding agent, or deterioration of electrical characteristics or the like is significantly reduced or prevented.

An electronic component according to a preferred embodiment of the present invention may be configured so that the first front surface electrode and the second front surface electrode have a rectangular or substantially rectangular shape, the first front surface electrode and the second front surface electrode are provided on the front surface of the substrate so that a longitudinal direction of each of the first front surface electrode and the second front surface electrode is perpendicular or substantially perpendicular to a longitudinal direction of the substrate, and each of the first groove and the second groove is located in a side surface that is perpendicular or substantially perpendicular to the longitudinal direction of the substrate.

According to this configuration, each of the grooves is located in a side surface orthogonal to the longitudinal direction of the substrate. As a result, even if the solder climbs and wets onto the chip component, it is possible to prevent the solder from adhering to a region of the chip component which is subject to large distortion due to variations in applied voltage.

An electronic component according to a preferred embodiment of the present invention may be configured so that each of the first groove and the second groove is located substantially at a center of the side surface that is perpendicular or substantially perpendicular to the longitudinal direction of the substrate.

According to this configuration, each of the grooves is located at substantially the center portion of the side surface so as to allow the bonding agent to easily escape to the grooves. As a result, it is possible to reduce the amount of bonding agent that climbs and wets onto the front surface electrodes.

An electronic component according to a preferred embodiment of the present invention may be configured so that the chip component is a multilayer ceramic capacitor including a ceramic laminate, the ceramic laminate including a plurality of ceramic layers and a plurality of inner electrodes alternately laminated on each other, the ceramic laminate including the first outer electrode and the second outer electrode, and the multilayer ceramic capacitor is mounted so that the front surface of the substrate and the inner electrodes are parallel or substantially parallel to each other.

According to this configuration, by controlling the direction in which to mount the multilayer ceramic capacitor, it is possible to prevent a bonding agent made of a solder or the like from adhering to a region of the chip component which is subject to large distortion due to variations in applied voltage. Moreover, a substrate having a rectangular or substantially rectangular parallelepiped shape is used, and the multilayer ceramic capacitor is mounted on the substrate. Therefore, structural design and mounting are easy, and a mounting strength and electrical characteristics equivalent to those of mounting structures commonly used in related art can be achieved.

When the multilayer ceramic capacitor is mounted onto the circuit board by using the electronic component according to various preferred embodiments of the present invention, the amount of metal plating that defines the connecting conductors, and the amount of solder to be applied can be reduced and, in addition, a defect in the bond created by the bonding agent at the time of mounting, or deterioration of electrical characteristics or the like are significantly reduced or prevented. Because the amount of solder that climbs and wets onto the chip component (multilayer ceramic capacitor) is significantly reduced, it is possible to reduce transmission of vibration of the chip component via the substrate to the circuit board on which the electronic component is mounted. Further, the electronic component has a simple structure and allows miniaturization, and allows easy mounting onto the circuit board. Furthermore, it is possible to ensure a mounting strength and electrical characteristics equivalent to those of mounting structures commonly used in related art.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A-2D are four-side views of the electronic component according to a preferred embodiment of the present invention.

DETAILED DESCRIPTION OF THE PREFERRED EMBODIMENTS

Figure 1A:
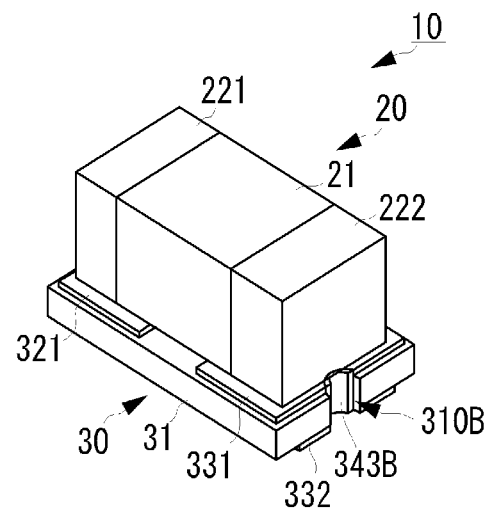
FIGS. 1A and 1B are perspective views respectively illustrating the outward appearance and mounting state of an electronic component according to a preferred embodiment of the present invention.
Figure 1B:
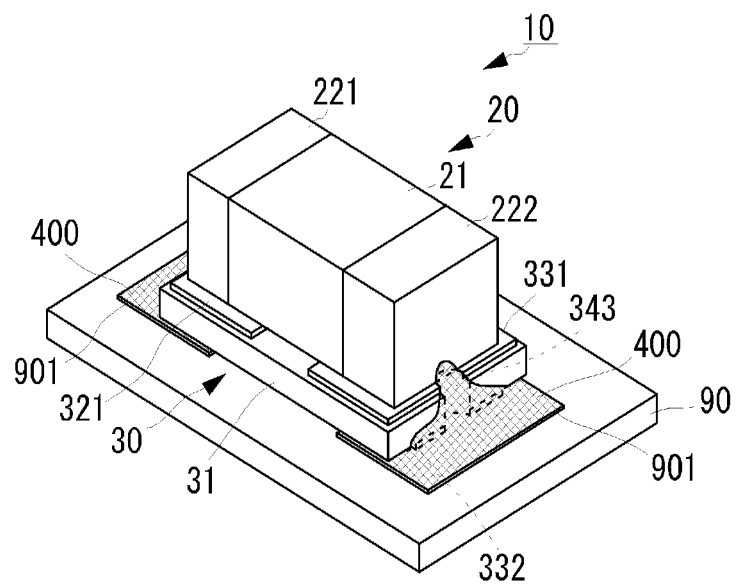
Figure 3A:
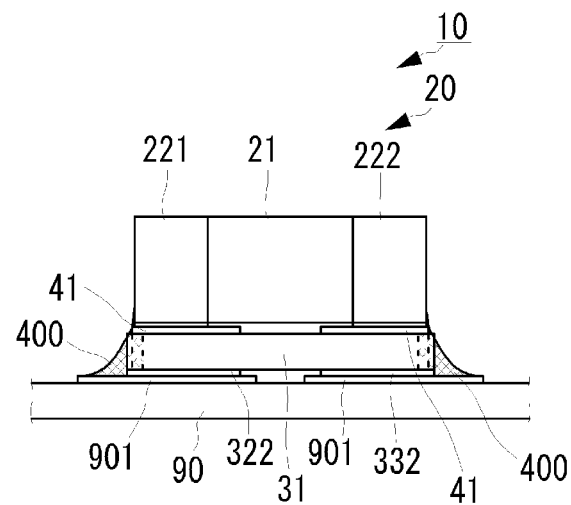
FIGS. 3A and 3B are a first side view and a second side view each illustrating the mounting state of the electronic component according to a preferred embodiment of the present invention.
Figure 3B:
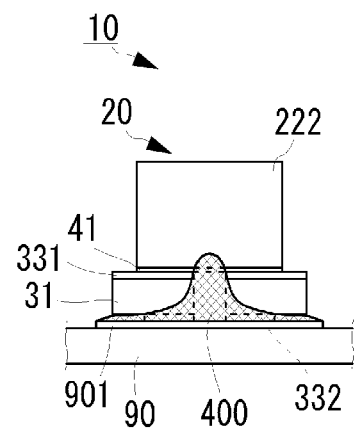

An electronic component according to preferred embodiments of the present invention will be described with reference to the drawings. FIG. 1A is a perspective view of the outward appearance of an electronic component 10 according to a preferred embodiment of the present invention. FIG. 1B is a perspective view of the mounting state of the electronic component 10. FIGS. 2A-2D are four-side views of the electronic component 10 according to the present preferred embodiment, of which FIG. 2A is a plan view, FIG. 2B is a first (longitudinal) side view, FIG. 2C is a second (lateral) side view, and FIG. 2D is a rear view. FIGS. 3A and 3B are a first side view and a second side view each illustrating the mounting state of the electronic component 10 according to the present preferred embodiment.

The electronic component 10 includes a multilayer ceramic capacitor (chip component) 20 and an interposer 30.

The multilayer ceramic capacitor 20 includes a ceramic laminate 21 preferably having a rectangular or substantially rectangular parallelepiped shape. The ceramic laminate 21 has a predetermined number of flat inner electrodes (not illustrated) that are laminated with dielectric layers therebetween. A first outer electrode 221 and a second outer electrode 222 are located at opposite ends in the longitudinal direction of the ceramic laminate 21. The first outer electrode 221 and the second outer electrode 222 connect to different inner electrodes. The inner electrodes may be laminated either in a direction perpendicular or substantially perpendicular (normal) to a first principal surface and a second principal surface that are flat surfaces of a substrate 31, or in the direction of a plane perpendicular or substantially perpendicular to the direction of the normal.

The first outer electrode 221 and the second outer electrode 222 are located not only on opposite end surfaces in the longitudinal direction but extend over from the opposite end surfaces in the longitudinal direction to opposite end surfaces in the lateral direction (direction perpendicular or substantially perpendicular to the longitudinal direction), the top surface, and the bottom surface. By taking corrosion resistance and electrical conductivity into consideration, predetermined metal plating is applied to the first outer electrode 221 and the second outer electrode 222.

The multilayer ceramic capacitor 20 arranged in this way has a length (longitudinal direction) by width (lateral direction) dimension of approximately, for example, 3.2 mm×1.6 mm, 2.0 mm×1.25 mm, 1.6 mm×0.8 mm, 1.0 mm×0.5 mm, or 0.6 mm×0.3 mm.

The interposer 30 includes the substrate 31. The substrate 31 is preferably made of insulating resin with a thickness of about 0.5 mm to about 1.0 mm, for example. When viewed in the direction of the normal, the substrate 31 preferably is rectangular or a substantially rectangular shape similar to the multilayer ceramic capacitor 20.

When viewed in the direction of the normal, the substrate 31 is larger than the multilayer ceramic capacitor 20 in both the longitudinal direction and the lateral direction. For example, the substrate 31 has a size that extends off the length and width of the multilayer ceramic capacitor 20 by a predetermined ratio, or has a shape that extends off the outer periphery of the multilayer ceramic capacitor 20 by a predetermined length.

A recess (first groove) 310A and a recess (second groove) 310B are located at opposite ends in the longitudinal direction of the substrate 31, at substantially the center position in the lateral direction. The recesses 310A and 310B penetrate the substrate 31 in the thickness direction in such a way as to define a circular arc with a predetermined diameter when viewed in the direction of the normal.

The recess 310A has such a shape that the intermediate portion of its circular arc extends into the space under the first outer electrode 221 of the multilayer ceramic capacitor 20. In other words, when viewed in the direction of the normal, the recess 310A is arranged so that the intermediate portion of its circular arc overlaps the multilayer ceramic capacitor 20. Likewise, the recess 310B has such a shape that the intermediate portion of its circular arc extends into the space under the second outer electrode 222 of the multilayer ceramic capacitor 20. Consequently, the multilayer ceramic capacitor 20 is mounted in such a way that the first outer electrode 221 and the second outer electrode 222 overlap the intermediate portions of the recesses 310A and 310B, respectively.

A first mounting electrode (first front surface electrode) 321 and a second mounting electrode (second front surface electrode) 331 are located on the first principal surface (front surface) of the substrate 31. The first mounting electrode 321 and the second mounting electrode 331 are located at a predetermined distance from opposite side surfaces in the longitudinal direction of the substrate 31. Each of the first mounting electrode 321 and the second mounting electrode 331 are arranged so as to extend to the position of a predetermined length from the side surface in the longitudinal direction toward the center of the longitudinal direction. The first mounting electrode 321 and the second mounting electrode 331 are located at a predetermined distance from opposite end portions in the lateral direction of the substrate 31.

The shape of the first mounting electrode 321 and the second mounting electrode 331 may be set as appropriate in accordance with the shape of the outer electrodes of the multilayer ceramic capacitor 20. In this way, a so-called self-alignment effect is obtained when mounting the multilayer ceramic capacitor 20 onto the interposer 30, allowing the multilayer ceramic capacitor 20 to be mounted at a desired position on the interposer 30. This self-alignment effect prevents climbing up and wetting of solder from an external circuit board 90 more reliably.

A first external connection electrode (first back surface electrode) 322 and a second external connection electrode (second back surface electrode) 332 are located on the second principal surface (back surface) of the substrate 31. The first external connection electrode 322 is located opposite to the first mounting electrode 321. The second external connection electrode 332 is located opposite to the second mounting electrode 331. The shape of the first external connection electrode 322 and the second external connection electrode 332 is such that the first external connection electrode 322 and the second external connection electrode 332 are not located in an area of a predetermined length from opposite ends along the lateral direction of the substrate 31. The shape of the first external connection electrode 322 and the second external connection electrode 332 may be set as appropriate in accordance with the shape of a mounting land 901 of the external circuit board 90 on which the electronic component 10 is mounted.

Connecting conductors 343A and 343B are located in opposite side wall surfaces of the substrate 31 which define the recesses 310A and 310B, respectively, and have a circular arc shape in plan view. The connecting conductor 343A provides electrical continuity between the first mounting electrode 321 and the first external connection electrode 322, and the connecting conductor 343B provides electrical continuity between the second mounting electrode 331 and the second external connection electrode 332.

The connecting conductors 343A and 343B are not arranged over the entire wall surfaces of the recesses 310A and 310B, respectively, but in a portion of the wall surfaces. More specifically, as described above, the first mounting electrode 321 and the second mounting electrode 331 are provided at a predetermined distance from the side surfaces of the substrate 31 in which the recesses 310A and 310B are located, respectively. Like the first mounting electrode 321 and the second mounting electrode 331, each of the connecting conductors 343A and 343B is provided at a predetermined distance from the side surface of the substrate 31. Preferably, the connecting conductors 343A and 343B do not project to the outer side portions of the first mounting electrode 321 and the second mounting electrode 331, respectively.

Because the first mounting electrode 321 and the second mounting electrode 331, and the like are spaced apart from the side surface of the substrate 31 in this way, it is possible to prevent solder from climbing and wetting onto the side surface of the multilayer ceramic capacitor 20 via the first mounting electrode 321 and the second mounting electrode 331. As a result, it is possible to prevent a bonding agent 400 made of a solder or the like from adhering to a region of the multilayer ceramic capacitor 20 which undergoes distortion due to variations in applied voltage.

In a case in which each of the connecting conductors 343 is arranged over the entire wall surface of each of the corresponding recesses 310, when cutting the side surface of the substrate 31 during manufacture of the interposer 30, the connecting conductors 343 are also cut, causing burrs to be generated on the connecting conductors 343. However, such generation of burrs is prevented by arranging each of the connecting conductors 343 at a predetermined distance from the side surface. As a result, it is possible to reduce the risk that the generated burrs may deteriorate the electrical characteristics of the connecting conductors 343 located in the recesses 310, or may cause a decrease in the strength of the bond created by the bonding agent 400.

The first outer electrode 221 of the multilayer ceramic capacitor 20 is mounted on the first mounting electrode 321 of the interposer 30. The second outer electrode 222 of the multilayer ceramic capacitor 20 is mounted on the second mounting electrode 331 of the interposer 30. At this time, bonding of the first outer electrode 221 and the first mounting electrode 321, and bonding of the second outer electrode 222 and the second mounting electrode 331 are accomplished by re-melting of the metal plating (for example, tin plating) of the first outer electrode 221 and the second outer electrode 222, on the mounting surface side of the first outer electrode 221 and the second outer electrode 222. Consequently, a bonding layer 41 is formed between the first outer electrode 221 and the first mounting electrode 321 to provide electrical and mechanical connection, and between the second outer electrode 222 and the second mounting electrode 331 to provide electrical and mechanical connection.

If metal plating similar to that applied to the outer electrodes is applied to the first mounting electrode 321 and the second mounting electrode 331 in advance, the above-mentioned connection is established together with the metal plating on the first mounting electrode 321 and the second mounting electrode 331. The bonding of the multilayer ceramic capacitor 20 and the interposer 30 may be performed by a bonding agent (for example, a solder), without using the metal plating on the first and second outer electrodes 221 and 222 or the metal plating on the interposer 30.

The electronic component 10 constructed in this way is mounted onto the external circuit board 90 as illustrated in FIGS. 1B and 3. At this time, the electronic component 10 is mounted in such a way that each of the first external connection electrode 322 and the second external connection electrode 332 connects to the corresponding mounting land 901 of the external circuit board 90. The bonding agent (for example, a solder) 400 is used for the connection between each of the first external connection electrode 322 and the second external connection electrode 332 and the corresponding mounting land 901.

This bonding using the bonding agent 400 is performed in such a way that a fillet is provided at least in an area extending from the mounting land 901 of the external circuit board 90 to each of the connecting conductors 343 in the corresponding recesses 310 of the interposer 30. Forming a fillet in this way prevents lifting of the electronic component 10 at the time of mounting, ensures bond strength, and enables a visual check for bond failures, and thus proves very advantageous. Although a solder is preferred as the bonding agent 400, any material other than a solder may be used as a bonding agent as long as the material has appropriate wettability and electrical conductivity.

Performing bonding by using the bonding agent 400 in this way presents the following problem. That is, in a case where a large amount of bonding agent is supplied, it is conceivable that excess bonding agent 400, more than necessary to form a fillet at the connecting conductors 343A and 343B in the recesses 310A and 310B, climbs onto the upper surface side of the interposer 30 via the connecting conductors 343A and 343B, respectively.

However, according to this preferred embodiment, opposite ends of the interposer 30 are spaced apart from the corresponding opposite ends of the multilayer ceramic capacitor 20. Accordingly, even if the bonding agent 400 climbs and wets onto the upper surface side of the interposer 30, the bonding agent 400 is unlikely to reach the first and second outer electrodes 221 and 222. Therefore, the amount of the bonding agent 400 that climbs and wets onto the principal surfaces of the first and second outer electrodes 221 and 222 (opposite end surfaces in the longitudinal direction of the multilayer ceramic capacitor 20) is significantly reduced.

Further, the recesses 310A and 310B that extend into the space under the bottom surface of the multilayer ceramic capacitor 20 are provided, and the connecting conductors 343A and 343B are located only in a portion of the recesses 310A and 310B, respectively. Accordingly, as the bonding agent 400 climbs and wets onto the principal surface of the interposer 30, the bonding agent 400 goes through the bottom surface of the multilayer ceramic capacitor 20 so as to further reduce the amount of the bonding agent 400 that climbs and wets onto the principal surfaces of the first and second outer electrodes 221 and 222.

Therefore, with the configuration according to this preferred embodiment, supposing that the amount of the bonding agent 400 is just sufficient to directly mount the multilayer ceramic capacitor 20 onto the mounting land 901 of the external circuit board 90, the amount of the bonding agent 400 that climbs up and wets can be limited, even at maximum, to the amount by which the bonding agent 400 climbs up and wets from the mounting surface of the principal surface of each of the first and second outer electrodes 221 and 222 of the multilayer ceramic capacitor 20.

The specific configuration and the like of the electronic component 10 can be designed and modified as appropriate, and the operation and effects described with reference to the above-mentioned preferred embodiments are merely illustrative of the most preferred operation and effects that arise from the present invention. It is to be understood that the operation and effects according to the present invention are not limited to those described above with reference to the above-mentioned preferred embodiments.

In the above-mentioned preferred embodiments, each of the recesses 310 is preferably located in the side surface extending along the lateral direction of the substrate 31. However, each of the recesses 310 may be provided in the side surface extending along the longitudinal direction (hereinafter, referred to as longitudinal side surface). FIGS.

Figure 4A:
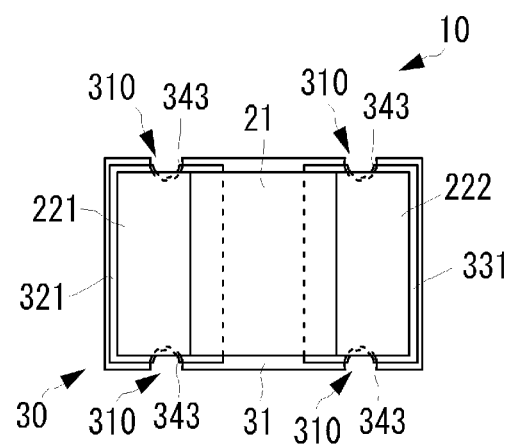
FIGS. 4A and 4B are top views each illustrating another example of an electronic component.
Figure 4B:
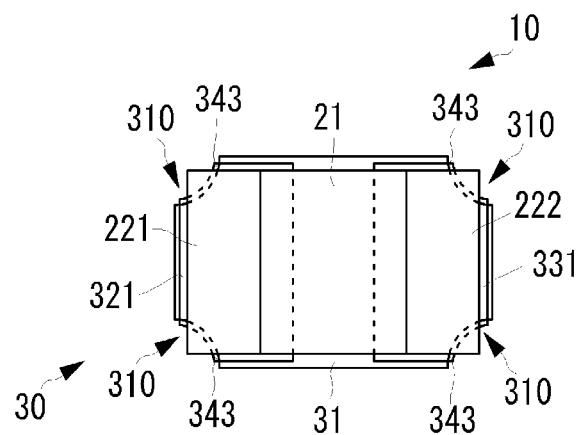

4A and 4B are top views illustrating another example of the electronic component 10. FIGS. 4A and 4B correspond to FIG. 2A.

In the case of FIG. 4A, each of the first mounting electrode 321 and the second mounting electrode 331 is spaced apart from the longitudinal side surface. Further, four recesses 310 are provided in the longitudinal side surfaces located under the bottom surface of each of the first and second outer electrodes 221 and 222 of the multilayer ceramic capacitor 20. The recesses 310 have such a shape that the intermediate portion of their circular arc extends into the space under the bottom surface of each of the first outer electrode 221 and the second outer electrode 222. In the case of FIG. 4B, the recesses 310 in FIG. 4A are located at four corner portions defined by the side surfaces.

In these cases, as in the above-mentioned preferred embodiment, each of the connecting conductors 343 located in the corresponding recesses 310 is spaced apart from the side surface of the substrate 31. Therefore, it is possible to prevent climbing and wetting of the bonding agent such as a solder.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a substrate including:
        front and back surfaces that are parallel or substantially parallel to each other; and
        first and second side surfaces that are perpendicular or substantially perpendicular to the front and back surfaces and that oppose each other in a first direction;
        third and fourth side surfaces that are perpendicular or substantially perpendicular to the front and back surfaces and that oppose each other in a second direction that is perpendicular or substantially perpendicular to the first direction;
        a first front surface electrode disposed on the front surface of the substrate;
        a second front surface electrode disposed on the front surface of the substrate closer to the second side surface than the first front surface electrode is to the second side surface;
        a first back surface electrode disposed on the back surface of the substrate, opposite to the first front surface electrode;
        a second back surface electrode disposed on the back surface of the substrate, opposite to the second front surface electrode;
    a multilayer ceramic capacitor mounted on the front surface of the substrate and including:
        a ceramic laminate including a plurality of ceramic layers and a plurality of inner electrodes laminated on each other; and
        a first outer electrode and a second outer electrode that are located at respective end surfaces of the ceramic laminate that are opposite to each other in the first direction and extending from the respective end surface to a portion of a bottom surface of the ceramic laminate, the first outer electrode being connected to the first front surface electrode, and the second outer electrode being connected to the second front surface electrode; wherein
    the first front surface electrode is spaced apart from at least one of the first to fourth side surfaces of the substrate; and
    the second front surface electrode is spaced apart from at least one of the first to fourth side surfaces of the substrate.

2. The electronic component according to claim 1, wherein
    the first front surface electrode is spaced apart from the first side surface of the substrate; and
    the second front surface electrode is spaced apart from the second side surface of the substrate.

3. The electronic component according to claim 1, wherein
    the first front surface electrode is spaced apart from each of the first to fourth side surfaces of the substrate; and
    the second front surface electrode is spaced apart from each of the first to fourth side surfaces of the substrate.

4. The electronic component according to claim 1, wherein
    the substrate further includes:
        a first connecting conductor which is connected to the first front surface electrode and the first back surface electrode and spaced apart from each of the first to fourth side surfaces of the substrate; and
        a second connecting conductor which is connected to the second front surface electrode and the second back surface electrode and spaced apart from each of the first to fourth side surfaces of the substrate.

5. The electronic component according to claim 4, wherein
    the first front surface electrode is spaced apart from the first side surface of the substrate; and
    the second front surface electrode is spaced apart from the second side surface of the substrate.

6. The electronic component according to claim 4, wherein
    the first front surface electrode is spaced apart from each of the first to fourth side surfaces of the substrate; and
    the first front surface electrode is spaced apart from each of the first to fourth side surfaces of the substrate.

7. The electronic component according to claim 1, wherein
    the first outer electrode on the bottom surface of the ceramic laminate includes a portion which does not overlap the first front surface electrode when viewed in a direction perpendicular to the front and back surfaces of the substrate; and
    the second outer electrode on the bottom surface of the ceramic laminate includes a portion which does not overlap the second front surface electrode when viewed in the direction perpendicular to the front and back surfaces of the substrate.

8. The electronic component according to claim 7, wherein
    the first outer electrode on the end surface of the ceramic laminate includes a portion which does not overlap the first front surface electrode when viewed in the direction perpendicular to the front and back surfaces; and
    the second outer electrode on the end surface of the ceramic laminate includes a portion which does not overlap the second front surface electrode when viewed in the direction perpendicular to the front and back surfaces.

9. The electronic component according to claim 7, wherein
    the substrate further includes:

a first connecting conductor which is connected to the first front surface electrode and the first back surface electrode and spaced apart from each of the first to fourth side surfaces of the substrate; and a second connecting conductor which is connected to the second front surface electrode and the second back surface electrode and spaced apart from each of the first to fourth side surfaces of the substrate.

10. The electronic component according to claim 7, wherein
the first front surface electrode is spaced apart from the first side surface of the substrate; and
the second front surface electrode is spaced apart from the second side surface of the substrate.

11. The electronic component according to claim 7, wherein
the first front surface electrode is spaced apart from each of the first to fourth side surfaces of the substrate; and
the first front surface electrode is spaced apart from the each of first to fourth side surfaces of the substrate.

12. The electronic component according to claim 1, wherein
the first outer electrode on the bottom surface of the ceramic laminate includes a portion which does not overlap the substrate when viewed in a direction perpendicular to the front and back surfaces of the substrate; and
the second outer electrode on the bottom surface of the ceramic laminate includes a portion which does not overlap the substrate when viewed in the direction perpendicular to the front and back surfaces of the substrate.

13. The electronic component according to claim 12, wherein
the substrate further includes:
a first connecting conductor which is connected to the first front surface electrode and the first back surface electrode and spaced apart from each of the first to fourth side surfaces of the substrate; and
a second connecting conductor which is connected to the second front surface electrode and the second back surface electrode and spaced apart from each of the first to fourth side surfaces of the substrate.

14. The electronic component according to claim 13, wherein the first connecting conductor includes a portion which overlaps the first outer electrode when viewed in the direction perpendicular to the front and back surfaces of the substrate; and
the second connecting conductor includes a portion which overlaps the second outer electrode when viewed in the direction perpendicular to the front and back surfaces of the substrate.

15. The electronic component according to claim 14, wherein
the first front surface electrode is spaced apart from the first side surface of the substrate; and
the second front surface electrode is spaced apart from the second side surface of the substrate.

16. The electronic component according to claim 14, wherein
the first front surface electrode is spaced apart from the each of first to fourth side surfaces of the substrate; and
the second front surface electrode is spaced apart from each of the first to fourth side surfaces of the substrate.

17. The electronic component according to claim 1, wherein
the substrate has a rectangular or substantially rectangular parallelepiped shape;
the ceramic laminate has a rectangular or substantially rectangular parallelepiped shape;
the first direction is parallel or substantially parallel to a longitudinal direction of the substrate and a longitudinal direction of the ceramic laminate; and
the substrate is larger than the multilayer ceramic capacitor in the first direction.

18. The electronic component according to claim 1, wherein
the first front surface electrode and the second front surface electrode have a rectangular or substantially rectangular shape; and
the first front surface electrode and the second front surface electrode are arranged on the front surface of the substrate so that a longitudinal direction of each of the first front surface electrode and the second front surface electrode is perpendicular or substantially perpendicular to a longitudinal direction of the substrate.

* * * * *